United States Patent
Tailliet

(10) Patent No.: US 9,502,110 B1
(45) Date of Patent: Nov. 22, 2016

(54) MODULAR CELL FOR A MEMORY ARRAY, THE MODULAR CELL INCLUDING A MEMORY CIRCUIT AND A READ CIRCUIT

(71) Applicant: STMicroelectronics (Rousset) SAS, Rousset (FR)

(72) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 14/964,156

(22) Filed: Dec. 9, 2015

(51) Int. Cl.
| | |
|---|---|
| *G11C 11/34* | (2006.01) |
| *G11C 14/00* | (2006.01) |
| *G11C 16/26* | (2006.01) |
| *G11C 11/419* | (2006.01) |

(52) U.S. Cl.
CPC ......... *G11C 14/0063* (2013.01); *G11C 11/419* (2013.01); *G11C 16/26* (2013.01)

(58) Field of Classification Search
CPC ............... G11C 14/0063; G11C 11/419; G11C 16/26
USPC ............ 365/185.08, 185.05, 185.07, 185.11, 365/154, 189.011
See application file for complete search history.

(56) References Cited

U.S. PATENT DOCUMENTS

| | | | |
|---|---|---|---|
| 8,792,275 B2 | 7/2014 | Shih et al. | |
| 9,007,113 B1* | 4/2015 | Felix | H03K 3/037 327/208 |
| 2013/0294161 A1* | 11/2013 | Lee | G11C 16/0433 365/185.08 |

* cited by examiner

*Primary Examiner* — Fernando Hidalgo
(74) *Attorney, Agent, or Firm* — Gardere Wynne Sewell LLP

(57) ABSTRACT

A memory cell for use within a memory array includes a memory circuit and a read circuit. The memory circuit includes a non-volatile memory element (for example, a floating gate transistor) coupled to an RS flip flop. The RS flip flop is configured with a p-channel transistor coupled to receive a first enable signal and an n-channel transistor coupled to receive a second enable signal. The assertion of the enable signals is offset in time to control operations for forcing latch nodes to a specific voltage and enabling latching operation. The read circuit includes latch circuit coupled to outputs of the RS flip flop and operable as a sense amplifier circuit. The memory and read circuits are fabricated within a rectangular circuit area. Many such rectangular circuit area may be positioned adjacent to each other in a row or column of the memory array.

24 Claims, 11 Drawing Sheets

MODULAR CELL FOR A MEMORY ARRAY, THE MODULAR CELL INCLUDING A MEMORY CIRCUIT AND A READ CIRCUIT

TECHNICAL FIELD

The present invention relates to memory cells and, in particular, to a modular cell for a memory array.

BACKGROUND

Reference is made FIG. 1 showing a conventional non-volatile static random access memory (NVSRAM) cell 10. The cell 10 includes a first electrically erasable programmable read only (EEPROM) memory string 12 formed by a floating gate transistor 14 connected in series with a select transistor 16 between a first supply voltage node 18a and a first latch node 20. The cell 10 further includes a second EEPROM memory string 22 formed by a floating gate transistor 24 connected in series with a select transistor 26 between the first supply voltage node 18a and a second latch node 30. The control gates of the floating gate transistors 14 and 24 are connected to a control gate line 32 which is driven by a control gate signal (CG). The control gates of the select transistors 16 and 26 are connected to a reload line 34 which is driven by a reload signal (Reload). The cell 10 further includes a flip-flop circuit formed by a static random access memory cell 40 of the well-known 6T-type including a latch circuit 42 formed by cross-coupled inverter circuits 44 and 46. Inverter circuit 44 is formed by a first p-channel transistor 48 coupled in series with a first n-channel transistor 50 between the second supply voltage node 18 and a third supply voltage node 19. The series connection of the drain terminals of transistors 48 and 50 is made at the first latch node 20. Inverter circuit 46 is formed by a second p-channel transistor 52 coupled in series with a second n-channel transistor 54 between the second supply voltage node 18 and third supply voltage node 19. The series connection of the drain terminals of transistors 52 and 54 is made at the second latch node 30. The control gates of the transistors in the inverter circuit 44 are coupled to the second latch node 30, and the control gates of the inverter circuit 46 are coupled to the first latch node 20. The first and second latch nodes 20 and 30, respectively, store complementary data states. A first access transistor 60 is coupled between the first latch node 20 and a first data line 62. A second access transistor 64 is coupled between the second latch node 30 and a second data line 66. The first and second data lines 62 and 66, respectively, carry complementary data states during read and write operations. The control gates of the access transistors 60 and 64 are connected to a word line 68 which is driven by a word line signal (WL).

Operation of this circuit for writing data into and reading data from the memory cell is well known in the art. The normal loading of non-volatile data into the SRAM is as follows:

The nonvolatile EEPROM cells are put in a read condition. Node 18a is set at low level, like node 19, and the CG line is put at a reference level (typically the thresholds of a virgin cell of 0.5V to 1V). The WL is set at low level. The Reload line is set at high level. A voltage ramp is then applied to the supply node 18 of the flip-flop. Each terminal of the flip-flop is connected to EEPROM cells in a different conduction state (differential, one erased, one programmed). The programmed cell at least draws more current than the erased cell (which in principle draws no current). This un-balances the flip-flop, which during its power up phase will be set to low at the side connected to the programmed cell.

An alternate activation mode consists in pulling high node 18a during the power up of the flip-flop. Then, the side of the flip-flop connected to the programmed cell will go high. Either activation mode (node 18a low or high) has known advantages and disadvantages.

The load process controlled by the supply of the flip-flop requires switching a power supply or controlling a voltage ramp on it, and the switching process will start when the supply of the flip-flop reaches the thresholds of the transistors in the flip-flop, based on the differential conduction of the EEPROM cells.

A memory array 80 as shown in FIG. 2 is formed by a plurality of cells 10 arranged in a matrix including a plurality of rows and columns. The first and second data lines 62 and 66 are shared by cells 10 in each column and are connected to sensing circuitry 82 and a write circuit 84. The word line 68 is shared by cells 10 in each row and is connected to a word line decoder circuit 86. The control gate line 32 and reload line 34 are shared by cells 10 in each row and are connected to a control circuit 88. In alternative embodiments, the lines 32 and 34 can be global lines that are shared across the entire array.

There is a need in the art for an improved memory cell structure.

SUMMARY

In an embodiment, a memory cell comprises: a memory circuit, comprising: a first floating gate transistor coupled between a reference voltage supply node and a first latch node; a second floating gate transistor coupled between the reference voltage supply node and a second latch node; a first true data input line; a second complementary data input line; and a reset/set (RS) flip flop circuit having a set input coupled to the first true data input line, a reset input coupled to the second complementary data input line, a true output and a complement output, and further including at least one n-channel transistor having a gate terminal driven by a first enable signal and at least one p-channel transistor having a gate terminal driven by a second enable signal; wherein during a read mode of operation for the memory cell said first and second enable signals are not simultaneously asserted.

In an embodiment, a memory cell fabricated as an integrated circuit within a rectangular circuit area comprises: a memory circuit occupying a first portion of the rectangular circuit area; and a read circuit occupying a second portion of the rectangular circuit area; wherein said first and second portions are adjacent to each other. The memory circuit comprises: a floating gate transistor memory element; a latch circuit having a first input coupled to data input line and a first output coupled to the floating gate transistor memory element; and an output transistor coupled to a data output line and having a control terminal coupled to a second output of the latch circuit. The read circuit comprises: an input coupled to the output transistor; and a latching sense amplifier circuit coupled to the input.

In an embodiment, a memory array comprises a plurality of memory cells, wherein each memory cell is fabricated as an integrated circuit within a rectangular circuit area, the rectangular circuit areas of the memory cells arranged adjacent to each other in one of a column or row of the memory array. Each memory cell comprises: a memory circuit occupying a first portion of the rectangular circuit area; and a read circuit occupying a second portion of the rectangular circuit area; wherein said first and second portions are adjacent to each other. The memory circuit comprises: a floating gate transistor memory element; a latch circuit having a first input coupled to data input line and a first output coupled to the floating gate transistor memory element; and an output transistor coupled to a data output line and having a control terminal coupled to a second output of the latch circuit. The read circuit comprises: an input coupled to the output transistor; and a latching sense amplifier circuit coupled to the input.

The memory cell and read circuit assembly presents the following advantages over prior art designs: a) simple and fast activation of the read process using fewer signals where all bits are read in parallel and in one quick pass; b) basic peripheral control logic which does not require use of a state machine (prior art designs with non-local sensing require sequential decoding of the sensing path and then storage of read data from the sense amplifier using a more complex sequence controlled by a state machine); and c) a high immunity to bit-flip because the flip-flop is output buffered and due to the connection to very low capacitance local bit lines. In addition, pre-charge operation is simple and effectuated internal to the flip-flop circuit of the cell.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
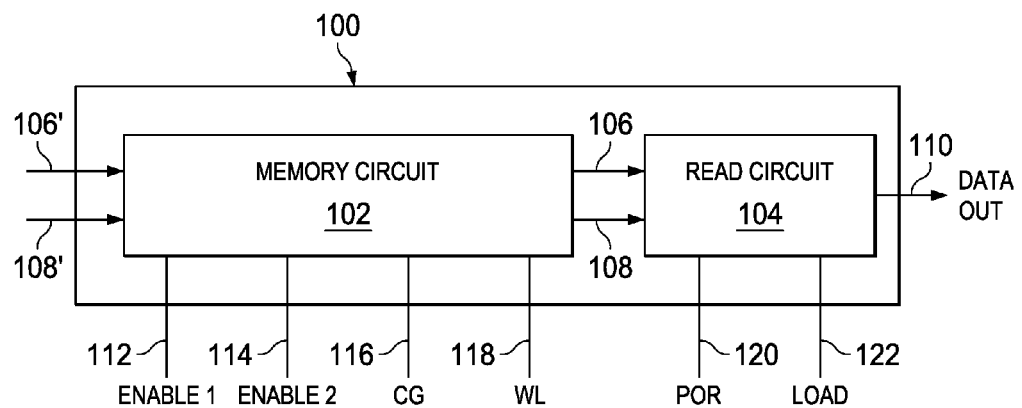
FIG. 3 is a block diagram of a memory cell in accordance with an embodiment.

Reference is now made to FIG. 3 showing a block diagram of a memory cell 100 in accordance with an embodiment. The memory cell 100 includes a memory circuit 102 and a read circuit 104. The memory circuit 102 includes a first (true) read data line 106 and a second (complement) read data line 108 that carry complementary data states during read operations, and a first (true) write data line 106' and a second (complement) write data line 108' that carry complementary data states during write operations. The read circuit 104 senses the data on the lines 106 and 108 during the data read operation to read data from the memory circuit 102 and generates a data output signal on output line 110. Operation of the memory circuit 102 is controlled by a first enable signal (Enable1) on first enable line 112, a second enable signal (Enable2) on second enable line 114, a control gate signal (CG) on control gate line 116 and a word line signal (WL) on word line 118. Operation of the read circuit 104 is controlled by a power on reset signal (POR) on power on reset line 120 and a load signal (Load) on load line 122.

Figure 4A:
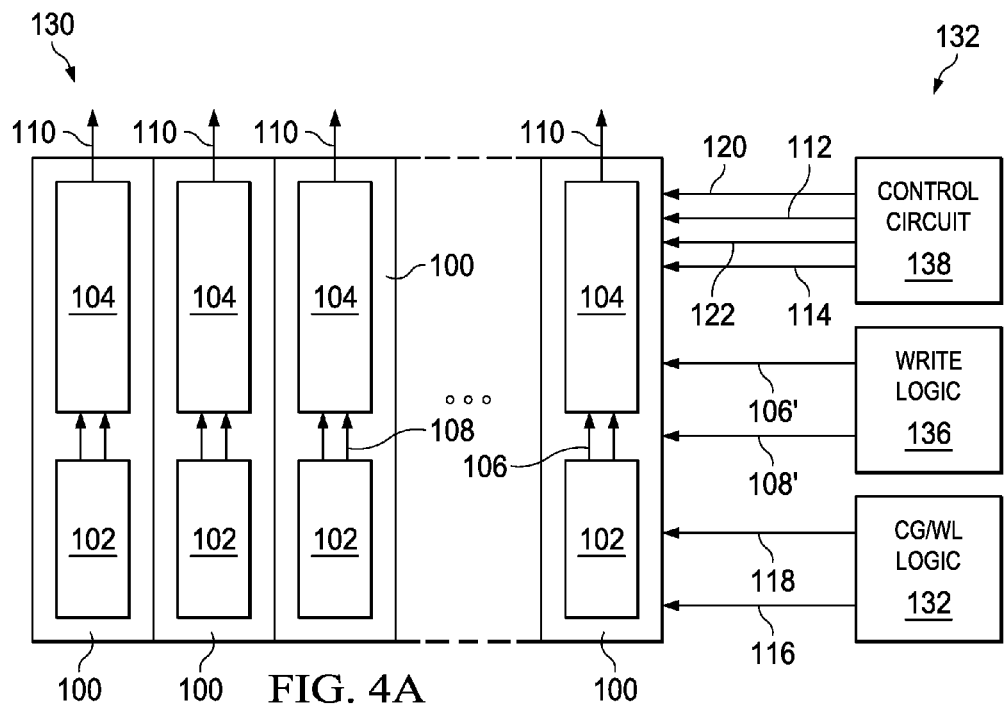
FIGS. 4A and 4B show example arrangements of memory cells to form a memory array.

FIG. 4A shows an example of an arrangement of the memory cells 100 to form a memory array 130. The layout of each cell 100 is tiled to form a row of the array 130. The array 130 in this configuration may, for example, form a register circuit. The array 130 is controlled for operation by logic circuits 132 including a control gate and word line control circuit 134 that is configured to generate the control gate signal (CG) on control gate line 116 and word line signal (WL) on word line 118. The logic circuits 132 further include a write logic circuit 136 that is configured to generate data for application to the lines 106' and 108' during data write operations. The logic circuits 132 still further include a control circuit 138 that is configured to generate the first enable signal (Enable1) on first enable line 112, second enable signal (Enable2) on second enable line 114, power on reset signal (POR) on power on reset line 120 and load signal (Load) on load line 122.

Figure 4B:
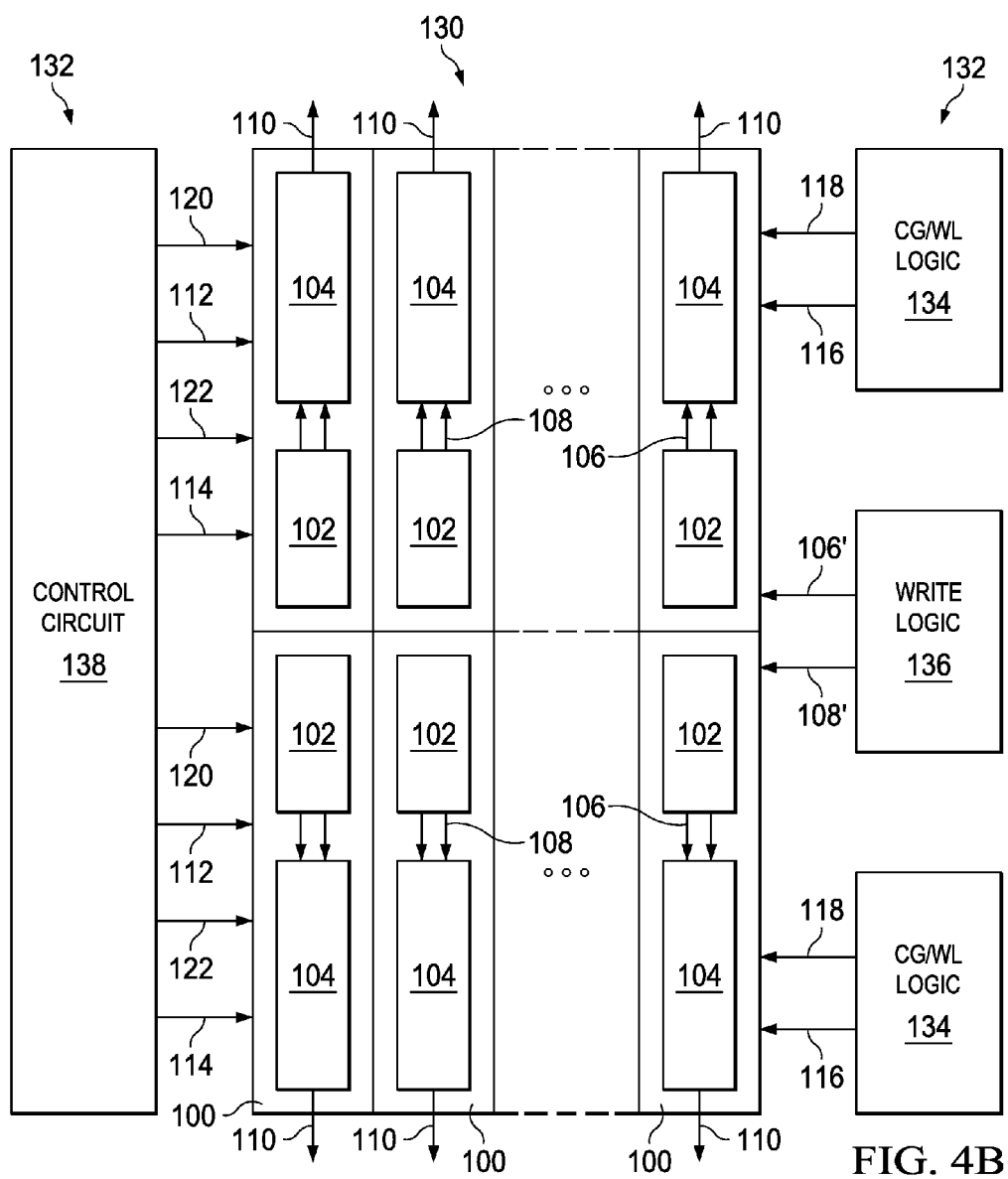

FIG. 4B shows another example of an arrangement of the memory cells 100 to form a memory array 130. The layout of each cell 100 is tiled to form two rows of the array 130. The array 130 in this configuration may, for example, form a register circuit.

Figure 5A:
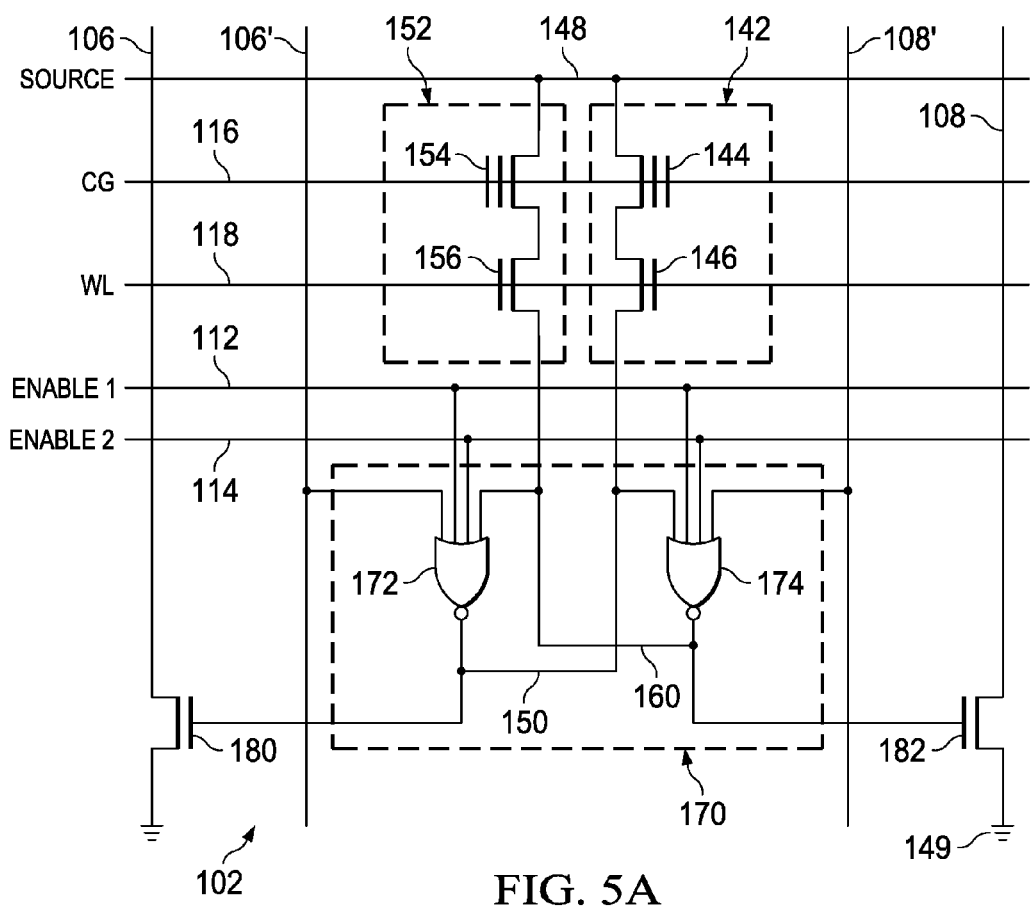
FIG. 5A is a circuit diagram of a memory circuit within the memory cell of FIG. 3.

Reference is now made to FIG. 5A showing a circuit diagram of the memory circuit 102. The memory circuit 102 includes a first EEPROM memory string 142 formed by a floating gate transistor 144 connected in series with a select transistor 146 between a source line 148 and a first latch node 150. The source line may, for example, be a ground reference node. The cell memory circuit 102 further includes a second EEPROM memory string 152 formed by a floating gate transistor 154 connected in series with a select transistor 156 between the source line 148 and a second latch node 160. The control gates of the floating gate transistors 144 and 154 are connected to a control gate line 116 which is driven by the control gate signal (CG). The control gates of the select transistors 146 and 156 are connected to the word line 118 which is driven by the word line signal (WL).

The memory circuit 102 further includes a latch circuit 170 in the form of a modified SR flip flop that includes the first latch node 150 and second latch node 160. The latch circuit 170 is formed by cross-coupled NOR gates 172 and 174. NOR gate 172 includes a first input coupled to the first (true) write data line 106', a second input coupled to the first enable line 112, a third input coupled to the second enable line 114 and a fourth input coupled to the second latch node 160 (and the second EEPROM memory string 152). An output of NOR gate 172 is coupled to the first latch node 150. NOR gate 174 includes a first input coupled to the second (complement) write data line 108', a second input coupled to the first enable line 112, a third input coupled to the second enable line 114 and a fourth input coupled to the first latch node 150 (and the first EEPROM memory string 142). An output of NOR gate 174 is coupled to the second latch node 160.

Figure 5B:
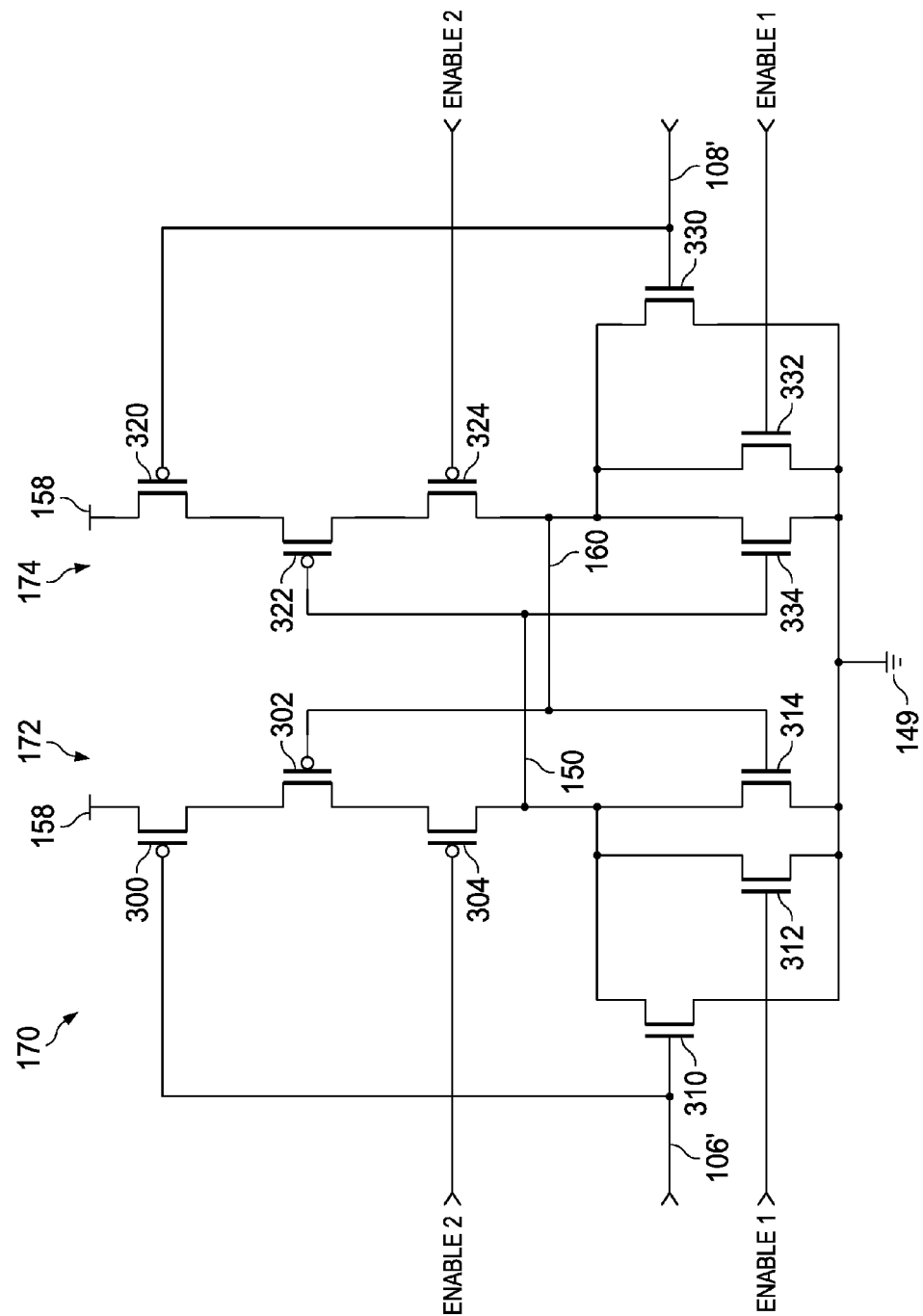
FIG. 5B is a circuit diagram for a modified SR flip flop latch circuit.

A circuit diagram of the modified SR flip flop latch circuit 170 is shown in FIG. 5B. The modified SR flip flop latch circuit 170 is NOR logic based.

The first NOR gate 172 comprises a first p-channel transistor 300, second p-channel transistor 302 and third p-channel transistor 304 whose source-drain paths are coupled in series between a first supply voltage node 158 and the first latch node 150 (this node presenting the complement output (Q-bar) of the SR flip flop). The first NOR gate 172 further comprises a first n-channel transistor 310, second n-channel transistor 312 and third n-channel transistor 314 coupled in parallel with each other between the first latch node and a second supply voltage node 149. The gate terminals of transistors 300 and 310 are coupled together to the first (true) write data line 106' (this node presenting the set (S) input of the SR flip flop). The gate terminal of transistor 312 is coupled to the first enable line 112 to receive the first enable signal (Enable1). The gate terminal of transistor 304 is coupled to the second enable line 114 to receive the second enable signal (Enable2).

The second NOR gate 174 comprises a first p-channel transistor 320, second p-channel transistor 322 and third p-channel transistor 324 whose source-drain paths are coupled in series between the first supply voltage node 158 and the second latch node 160 (this node presenting the true output (Q) of the SR flip flop). The second NOR gate 174 further comprises a first n-channel transistor 330, second n-channel transistor 332 and third n-channel transistor 334 coupled in parallel with each other between the second latch node 160 and the second supply voltage node 149. The gate terminals of transistors 320 and 330 are coupled together to the second (complement) write data line 108' (this node presenting the reset (R) input of the SR flip flop). The gate terminal of transistor 332 is coupled to the first enable line 112 to receive the first enable signal (Enable1). The gate terminal of transistor 324 is coupled to the second enable line 114 to receive the second enable signal (Enable2).

The gate terminals of transistors 302 and 314 are coupled together to the second latch node 160. The gate terminals of transistors 322 and 334 are coupled together to the first latch node 150.

Figure 6:
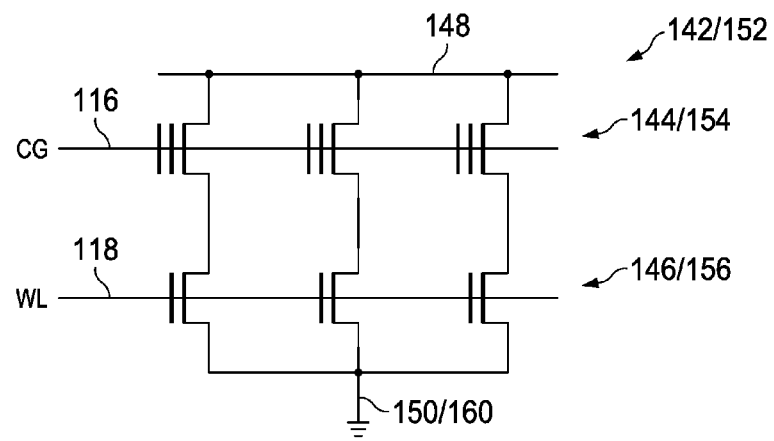
FIG. 6 is a diagram of a circuit configuration for the EEPROM memory strings.

The first and second EEPROM memory strings 142 and 152, respectively, may be formed with a circuit configuration as shown in FIG. 6. In this circuit configuration, each floating gate transistor 144 or 154 is formed by a plurality of floating gate transistors sharing a common gate terminal and a common source terminal. Likewise, each select transistor 146 or 156 is formed by a plurality of select transistors sharing a common gate terminal and a common drain terminal. This circuit configuration is advantageous because room is made within the layout of each memory circuit to include several non-volatile cells in parallel so as to support redundancy. As known to those skilled in the art, non-volatile memory cell may lose charge over time. This can occur intrinsically or extrinsically (for example, due to a defect). The data loading process from the non-volatile cells to the RS flip-flop relies on comparing the current sunk into the memory strings 142 and 152. Normally, one string contains an erased cell (not driving current) and the other string a programmed cell (driving current). In case one or both cells lose charge, the data may be lost. Putting several cells in parallel as shown in FIG. 6 prevents total loss of data because the data is redundant in several cells. A second advantage is that the electrical characteristics of small size EEPROM cells is spread. Including several cells in parallel reduces the spread by a statistical effect. A third advantage is that several programmed cells in parallel sink more current to ground, and as a result this will ease the data reloading process. In particular, if the current of programmed cells is more than the current of the series connected p-channel devices in the flip-flop, the switching operation is safer.

Reference is once again made to FIG. 5A. The memory circuit 102 still further includes a first output transistor 180 having a source-drain path coupled to the first (true) read data line 106 and a gate terminal coupled to the first latch node 150. The source terminal of transistor 180 is coupled to a second supply voltage node 149. The memory circuit 102 also includes a second output transistor 182 having a source-drain path coupled to the second (complement) read data line 108 and a gate terminal coupled to the second latch node 160. The source terminal of transistor 182 is coupled to the second supply voltage node 149.

Operation of the memory cell during the reload process for memory circuit 102 is not made by switching a global supply, but by instead first pre-charging (and equalizing) nodes 150 and 160 at 0V. The pre-charge is then turned off so as to cut any path to ground within the flip-flop (except for the programmed EEPROM cell). The high-side p-channel transistor is then turned on using the Enable 2 signal. As a result, there is less energy consumption and a more robust reload process. Other advantages are noted herein.

Figure 5C:
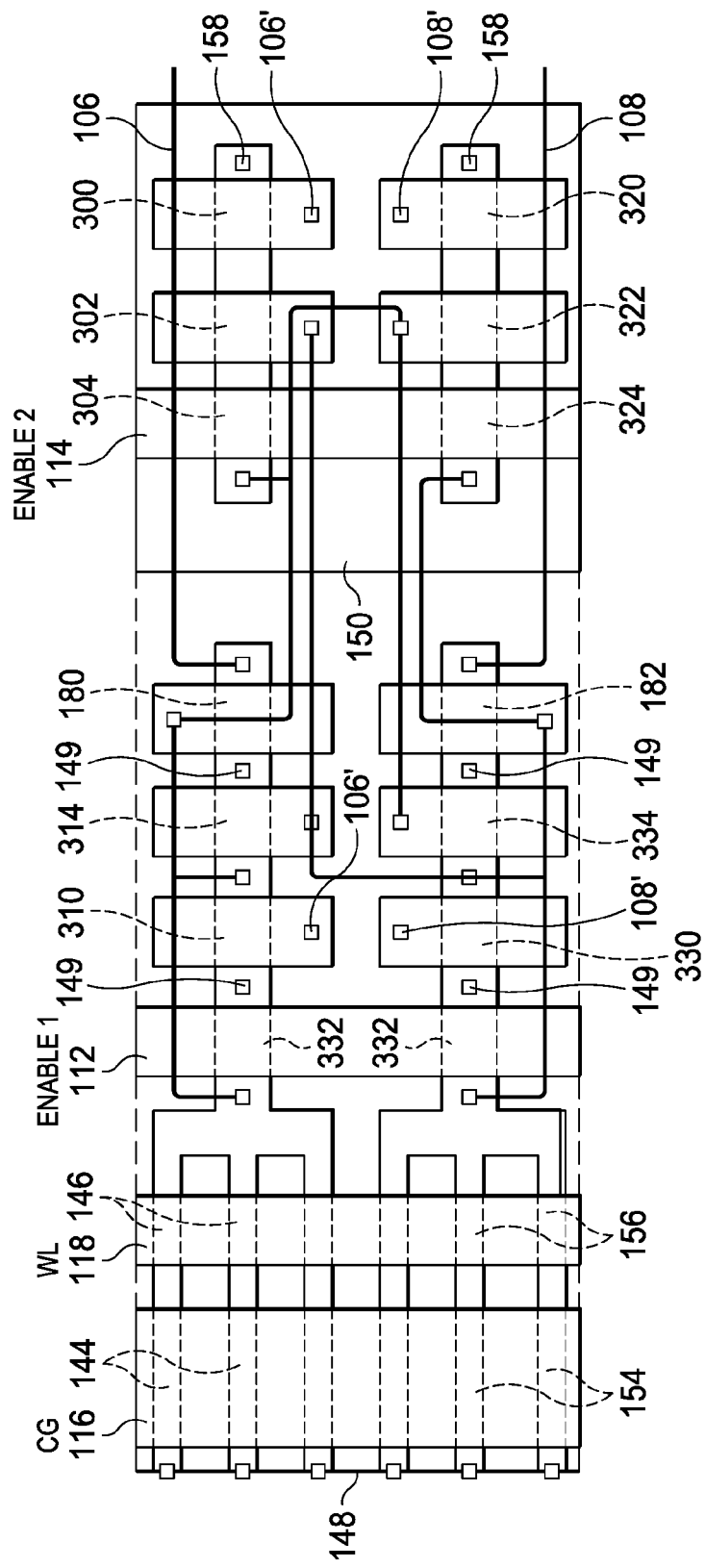
FIG. 5C is a layout for fabricating the memory circuit of FIGS. 5A and 5B.
Figure 7A:
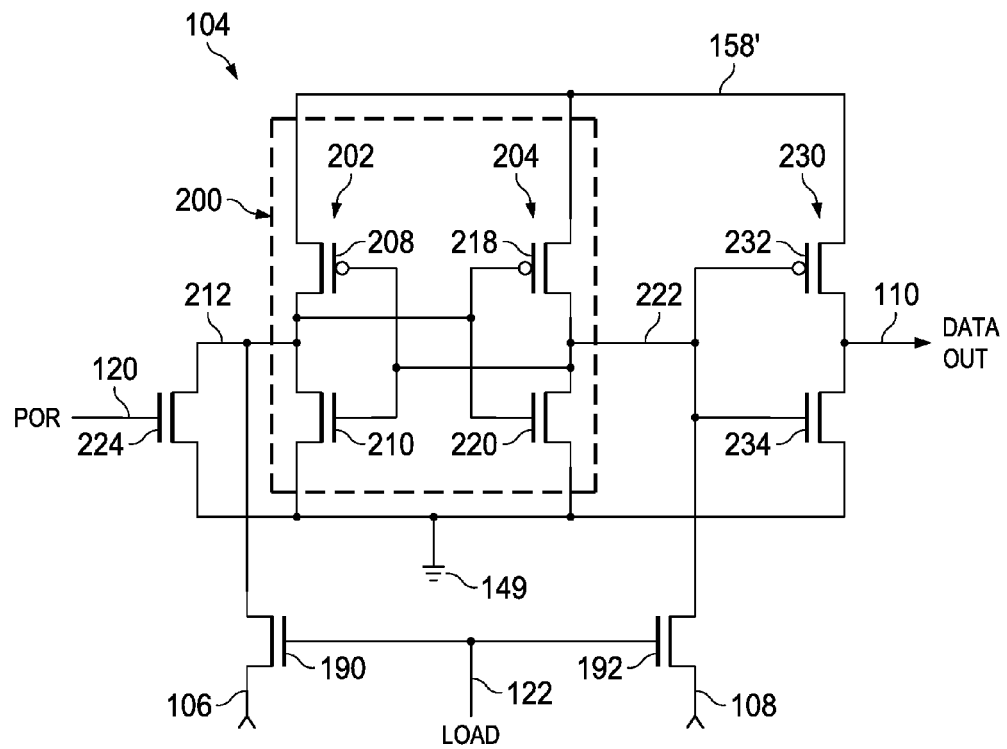
FIG. 7A is a circuit diagram of the read circuit within the memory cell of FIG. 3.

FIG. 5C shows an example layout for fabricating the memory circuit 102. The layout is rectangular in plan view with dimensions of approximately 2.1 µm×11 µm (occupying an area of about 24 µm$^2$). On the left hand side are the diffusions for the source and drain regions of the EEPROM memory strings 142 and 152 crossed by the gate electrodes for the control gate line 116 and word line 118. Those diffusions extend in the middle of the layout to form the source and drain regions of the n-channel transistors within the NOR gates 172 and 174 as well as for the transistors 180 and 182. It will be noted that the first enable line 112 forms the control gates for two n-channel transistors within the NOR gates 172 and 174. On the right hand side is the well that includes diffusions for the source and drain regions of the p-channel transistors within the NOR gates 174 and 174. It will be noted that the second enable line 114 forms the control gates for two p-channel transistors within the NOR gates 172 and 174. The solid lines indicate electrical connections formed by metal lines of the metallization layers for the fabricated circuit Reference is now made to FIG. 7A showing a circuit diagram of the read circuit 104. The read circuit 104 includes a first load transistor 190 having a source-drain path coupled to the first (true) read data line 106 and a gate terminal coupled to the load line 122. The source terminal of transistor 190 is coupled to the first (true) read data line 106 and the drain terminal is coupled to a first latch node 212. The read circuit 104 also includes a second load transistor 192 having a source-drain path coupled to the second (complement) read data line 108 and a gate terminal coupled to the load line 122. The source terminal of transistor 192 is coupled to the second (complement) read data line 108 and the drain terminal is coupled to a second latch node 222.

The read circuit 104 further includes a latch circuit 200 formed by cross-coupled inverter circuits 202 and 204. Inverter circuit 202 is formed by a first p-channel transistor 208 coupled in series with a first n-channel transistor 210 between a third supply voltage node 158' and the second supply voltage node 149 (note, node 158' is different from node 158). The series connection of the drain terminals of transistors 208 and 210 is made at the first latch node 212. Inverter circuit 204 is formed by a second p-channel transistor 218 coupled in series with a second n-channel transistor 220 between the third supply voltage node 158' and second supply voltage node 149. The series connection of the drain terminals of transistors 218 and 220 is made at the second latch node 222. The control gates of the transistors in the inverter circuit 202 are coupled to the second latch node 222, and the control gates of the inverter circuit 204 are coupled to the first latch node 212. The first and second latch nodes 212 and 222, respectively, store complementary data states received from the first (true) read data line 106 and second (complement) read data line 108.

The read circuit 104 still further includes an output inverter 230 formed by a third p-channel transistor 232 coupled in series with a third n-channel transistor 234 between the third supply voltage node 158' and the second supply voltage node 149. The series connection of the drain terminals of transistors 232 and 234 is made at the output line 110. The control gates of the transistors in the output inverter 230 are coupled to the second latch node 222.

The read circuit further includes a reset transistor 224 coupled between latch node 212 and the second supply voltage node 149. The gate of transistor 224 is coupled to the POR line 120.

Figure 7B:
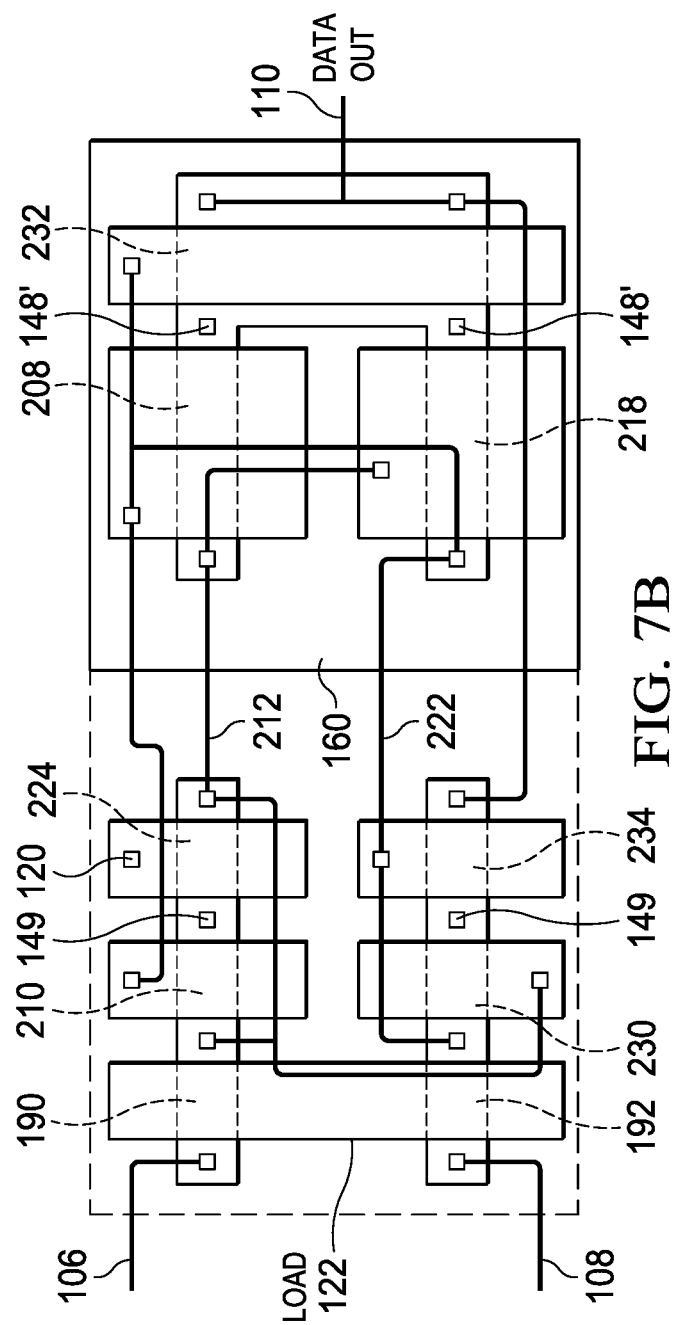
FIG. 7B is a layout for fabricating the read circuit of claim FIG. 7A.

FIG. 7B shows an example layout for fabricating the read circuit 104. The layout is rectangular in plan view with dimensions of approximately 2 µm×11 µm (occupying an area of about 24 µm²). On the left hand side are the diffusions for the source and drain regions of the n-channel transistors within the circuit. On the right hand side is the well that includes diffusions for the source and drain regions of the p-channel transistors within the circuit. The solid lines indicate electrical connections formed by metal lines of the metallization layers for the fabricated circuit.

Figure 8:
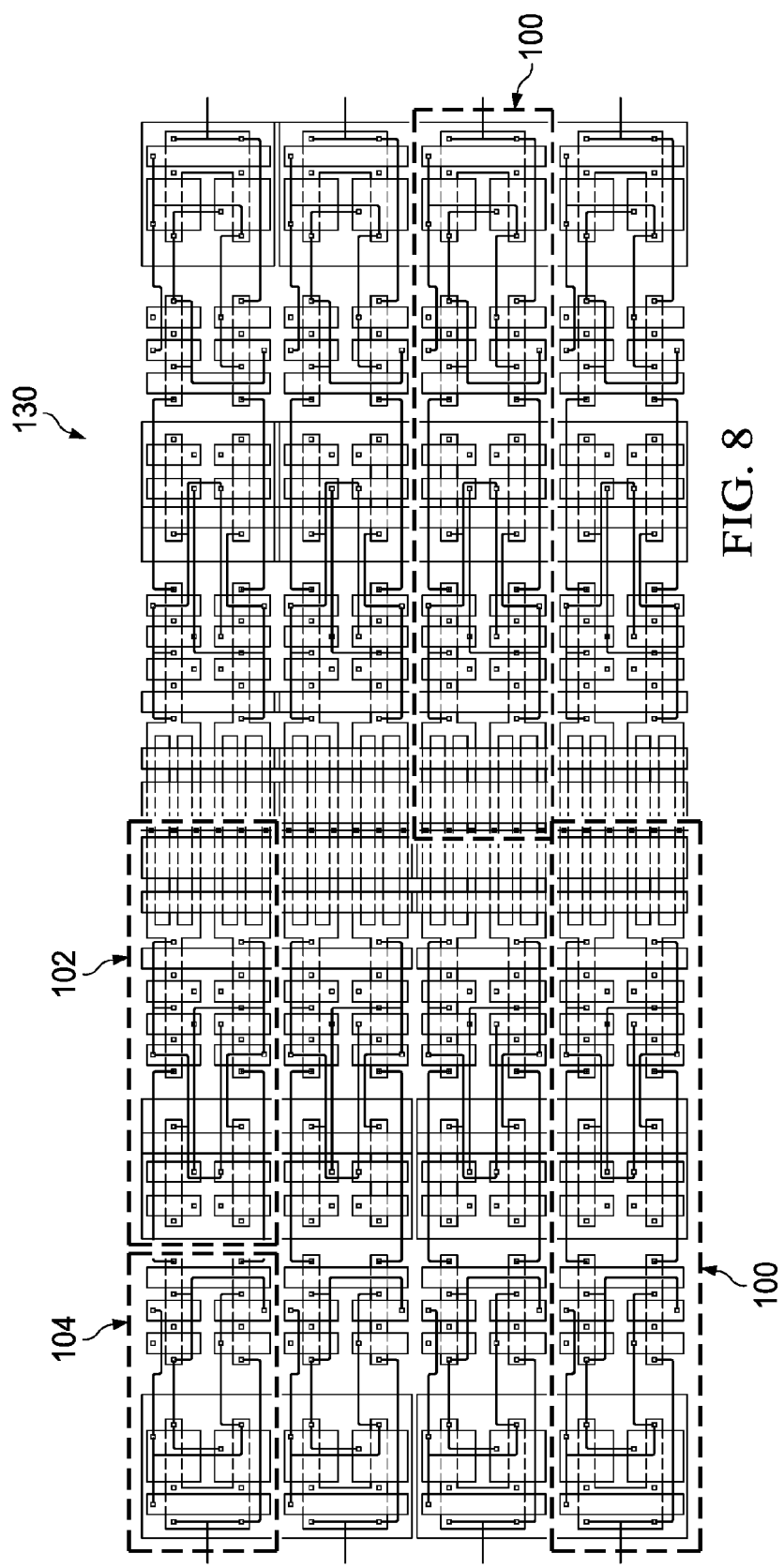
FIG. 8 is a layout of a memory array including memory cells formed by the layouts of FIGS. 5B and 7B.

FIG. 8 shows an example layout for a memory array 130 including a plurality of memory cells 100 formed with two rows and four columns. The illustrated layout corresponds generally to the memory array used in FIG. 4B. The layout on the left or right side of FIG. 8 generally to the memory array used in FIG. 4A. In these configurations, each memory cell occupies a rectangular circuit area that includes a first portion or region within which the integrated circuitry for the memory circuit 102 is fabricated and further includes a second portion or region within which the integrated circuit for the read circuit 104 is fabricated. The first and second portions or regions are positioned adjacent each other within the rectangular circuit area. Furthermore, in the memory array configurations, plural rectangular circuit areas, each corresponding to a given memory cell 100 of the array, are arranged adjacent to each other in a given row or column of the array.

Figure 1:
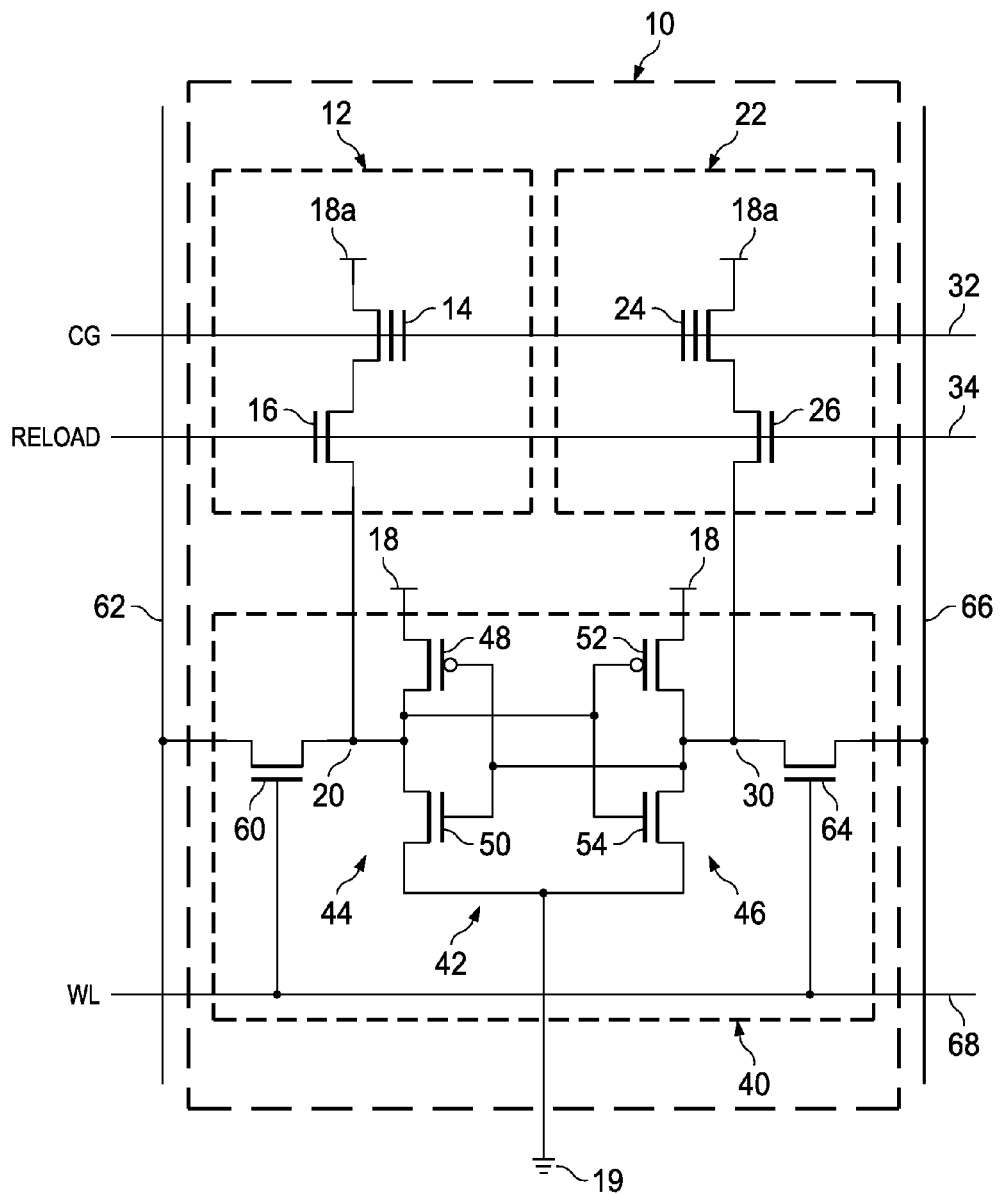
FIG. 1 is a circuit diagram for a conventional NVSRAM cell.
Figure 2:
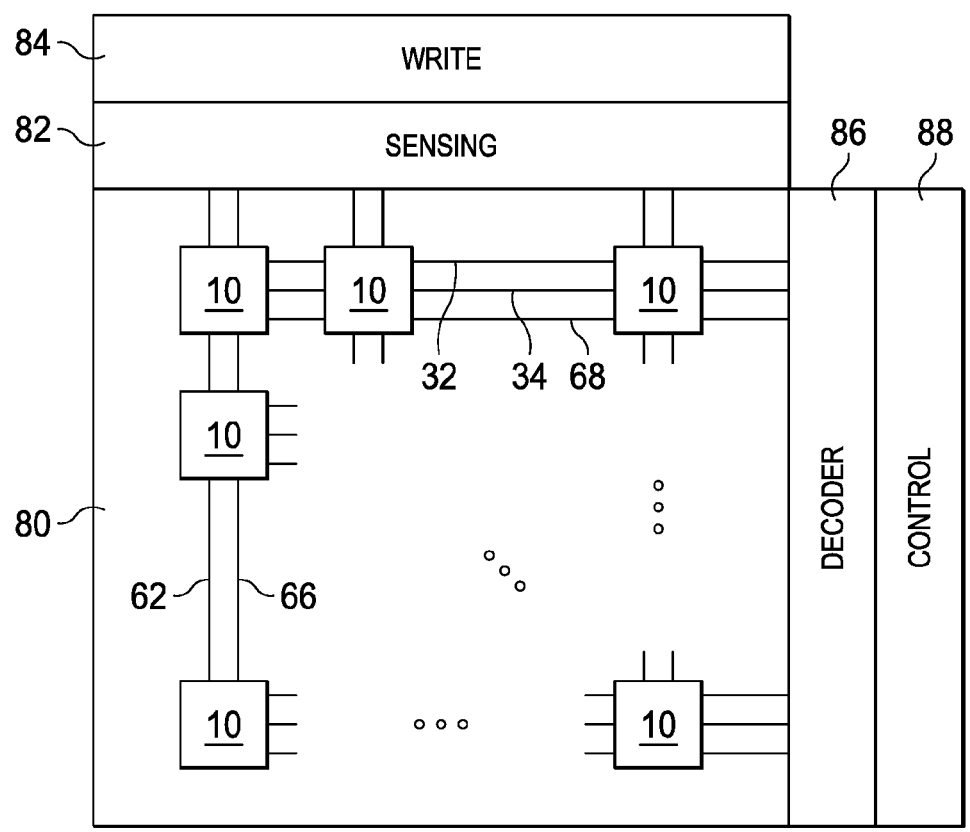
FIG. 2 is a block diagram of a memory circuit.

It will be noted from FIGS. 5A, 5B, 5C, 7A, 7B and 8 that the memory cell 100 is configured with an RS flip flop circuit (formed by the cross-coupled NOR gates) in the memory circuit 102. However, the RS flip flop circuit is modified such that there is a gating of n-channel transistor 312 and 332 using the Enable1 signal and a gating of p-channel transistors 304 and 324 using the Enable2 signal. The memory cell 100 further includes a data output latch formed by the cross-coupled inverters in the read circuit 104. This data output latch further functions as read sense amplifier. Thus, the sense amplifier is integrated at the level of each memory cell 100, rather than using a circuit peripheral to the array (as shown in FIG. 2). Latching for both data read and data write are also integrated at the level of each memory cell 100. Non-volatile data reload is provided locally within the SRAM structure of the memory cell. The RS flip flop circuit is further modified in the memory circuit 102 such that selection of the SRAM is made within the memory cell. By including the read circuit 104 within each memory cell 100 adjacent the memory circuit 102, there is a shorter data path between the memory circuit and sense amplification than is possible for configurations where sense amplification is performed in a peripheral circuit (see, FIG. 2). Because circuitry otherwise presented in the periphery is instead included in the memory cell 100, the peripheral circuits are simpler in design and are easily pitched to the array. A latched read output (line 110) is directly available from each memory cell 100.

It is an advantage over the prior art that each memory cell 100 integrates the electrically erasable non-volatile memory, storage, the SRAM cell, sensing and data latching functions. This advantage is permitted by split voltage activation (there are no high voltage elements in the memory cell). There is split voltage in programming. By this it is meant that the programming voltages are split between a positive and negative voltage. Programming requires that the EEPROM cell drain voltage is 13V higher than the CG line voltage. In conventional operation, the CG voltage=0V and the node 150 or 160 is at 13V. With split voltage, the control gate voltage=−8V and the node 150 or 160 is at 5V. This permits standard low voltage (5V) transistors to be used. The layout as shown in FIGS. 5C, 7B and 8 of each cell 100 is very compact. There is no risk with this circuit for data flipping error. The local interconnects between the memory circuit 102 and the read circuit 104 (sensing) are short and eliminate concerns with interconnect discrepancy.

Figure 9:
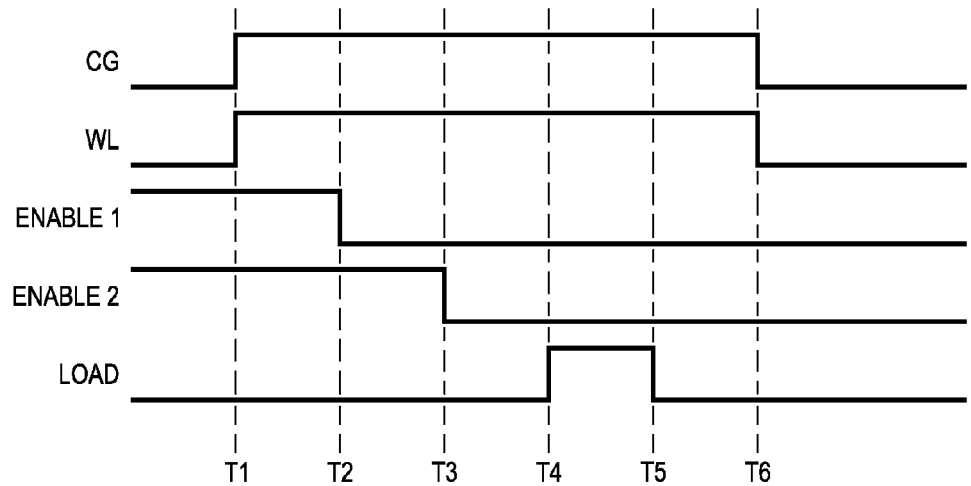
FIG. 9 a timing diagram for a read operation for the memory cell.

Reference is now made to FIG. 9 showing a timing diagram for a read operation for the memory cell 100. Prior to time t1, the first enable signal (Enable1) is at logic high and transistors 312 and 332 are turned on so that the first and second latch nodes 150 and 160 are forced to the voltage at the second supply voltage node 149. The second enable signal (Enable2) is also logic high and transistors 304 and 324 are turned off to disconnect the first and second latch nodes 150 and 160 from the first supply voltage node 158. This effectuates a quick and simple precharge of nodes 150 and 160 controlled within the memory cell. At time t1, the control gate signal (CG) is enabled to a reference voltage level (for example, 0.6 V) and the word line signal (WL) is asserted logic high. This activates the select transistors 146 and 156 in the first and second EEPROM memory strings 142 and 152 and the data stored by the floating gate transistors 144 and 154 is provided to the latch nodes 150 and 160. At time t2, the first enable signal (Enable1) is asserted logic low. This causes transistors 312 and 332 to be turned off thus releasing a clamping of the first and second latch nodes 150 and 160, respectively, to the voltage at the second supply voltage node 149. At time t3, the second enable signal (Enable2) is asserted logic low. The causes transistors 304 and 324 to be turned on so as to enable operation of each NOR gate 172 and 174. The timing offset is used for two reasons: a) to avoid a direct path between supplies that normally occurs when at the same time the N-channel is turned off and the P-channel is turned on (i.e., conduction domains overlap), so this limits the power consumption and noise that can be high as many cells will switch at same time; and b) makes for a more robust flip-flop switching, as the only path to ground, when the P-channel are turned on, will come from the EEprom cells alone, and not by the N-channel of the NOR gate going from the on state to the off state. At time t4, the load signal (Load) is asserted logic high. This turns on transistors 190 and 192 in the read circuit 104 to pass the complementary data on lines 106 and 108 into the read circuit. The latch circuit 200 latches the data and the logical inverse of the data state at latch node 222 is output on the data output line 110. At time t5, the load signal (Load) is deasserted, and at time t6 the control gate signal (CG) and the word line signal (WL) are both deasserted.

Figure 10:
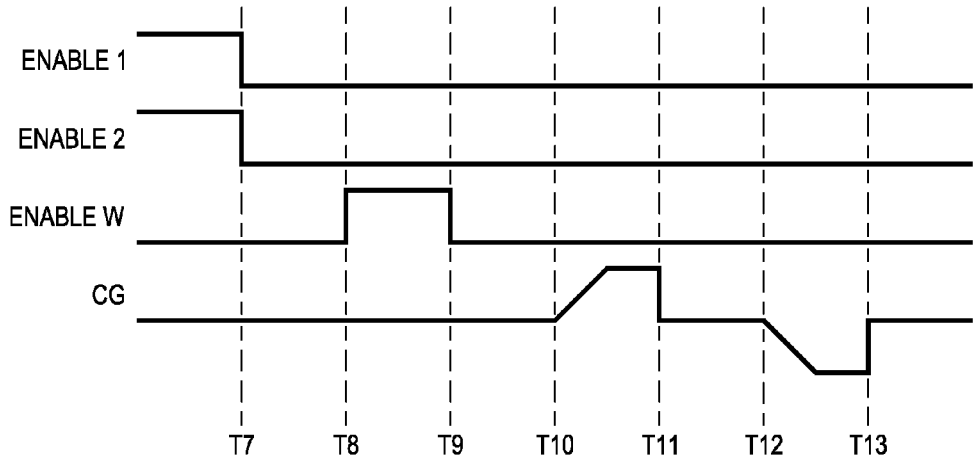
FIG. 10 a timing diagram for a write operation for the memory cell.
Figure 11:
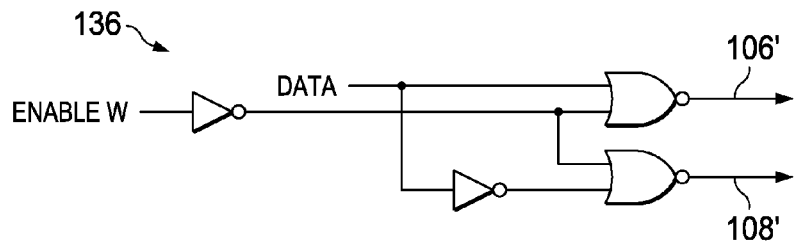
FIG. 11 is a circuit diagram for write logic.

Reference is now made to FIG. 10 showing a timing diagram for a write operation for the memory cell 100. At time t7, the first and second enable signals (Enable1 and Enable 2) are asserted logic low. At time t8, an enable write control signal (EnableW) is asserted logic high. This EnableW signal controls operation of the write logic 136 (FIG. 4A) to assert data on the first (true) write data line 106' and second (complement) write data line 108' (see, circuit diagram of FIG. 11). That data is received at the first inputs of the NOR gates 172 and 174 which operate, in response to the asserted first and second enable signals (Enable1 and Enable 2), to latch the data to the latch nodes 150 and 160. At time t9, the enable write control signal (EnableW) is deasserted. The time delay between t8 and t9 must be sufficient to ensure that the logic states on the first (true) write data line 106' and second (complement) write data line 108' and the latch nodes 150 and 160 become stable. At time t10, the control gate signal transitions to a positive voltage level (for example, 13V) and is held at that level until time t11. At time t12, the control gate signal transitions to a negative voltage level (for example, −8V) and is held at that level until time t13.

The writing of an EEPROM cell requires two steps: an erase step (where the cell ends into a blocked state with negative charge stored on floating gate and the threshold of the cell is about 2 to 3V) and then a programming step (where, selectively, EEPROM cells end in an ON state that is drawing current with positive charge stored on the floating gate and the threshold of cell is about −1V). The erase step erases all cells (whatever will be their final state). Cell drain voltage (nodes 146 and 156) is at 0V, and CG line is at 13V. The program step selectively programs EEPPROM cells. The CG line is at −8V, and either node 146 or 156 is high (5V, else 0V). The EEPROM cell having its drain at 5V will be programmed, and the cell having its drain kept low will stay erased. The WL signal must be about 7V during the program phase in order to transmit the 0V or 5V coming from nodes 150/160. The WL transitions to 7V between t12 and t13. It will be noted that supply 158 of memory cell 102 must be at 5V during the program operation. The supply 158' of read circuit 104 stays at the "normal" logic supply level. The supply for node 158 of 102 and the supply for node 158' of 104 are not the same power supplies.

The foregoing description has been provided by way of exemplary and non-limiting examples of a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A memory cell, comprising:
    a memory circuit, comprising:
        a first floating gate transistor coupled between a source line and a first latch node;
        a second floating gate transistor coupled between the source line and a second latch node;
        a first true data input line;
        a second complementary data input line; and
        a reset/set (RS) flip flop circuit having a set input coupled to the first true data input line, a reset input coupled to the second complementary data input line, a true output and a complement output, and further including at least one n-channel transistor having a gate terminal driven by a first enable signal and at least one p-channel transistor having a gate terminal driven by a second enable signal;
    wherein during a read mode of operation for the memory cell said first and second enable signals are not simultaneously asserted; and
    wherein during a write mode of operation for the memory cell said first and second enable signals are simultaneously asserted.

2. The memory cell of claim 1, wherein the first enable signal changes logic state prior to the second enable signal changing logic state, said first enable signal controlling the at least one n-channel transistor to selectively clamp at least one of the true output or complement output to a reference supply voltage node, and said second enable signal controlling the at least one p-channel transistor to selectively enable a latching operation by the RS flip flop circuit.

3. The memory cell of claim 1, further comprising:
    a first output transistor coupled to a true data output line and having a gate terminal coupled to the true output of the RS flip flop circuit; and
    a second output transistor coupled to a complement data output line and having a gate terminal coupled to the complement output of the RS flip flop circuit.

4. A memory cell comprising:
    a memory circuit, comprising:
        a first floating gate transistor coupled between a source line and a first latch node;
        a second floating gate transistor coupled between the source line and a second latch node;
        a first true data input line;
        a second complementary data input line; and
        a reset/set (RS) flip flop circuit having a set input coupled to the first true data input line, a reset input coupled to the second complementary data input line, a true output and a complement output, and further including at least one n-channel transistor having a gate terminal driven by a first enable signal and at least one p-channel transistor having a gate terminal driven by a second enable signal; and
    a read circuit including:
        a first input coupled to the first output transistor;
        a second input coupled to the second output transistor; and
        a latching sense amplifier circuit coupled to the first and second inputs;
    wherein during a read mode of operation for the memory cell said first and second enable signals are not simultaneously asserted.

5. The memory cell of claim 4, wherein the read circuit further includes an output inverter circuit having an input coupled to an output of the latching sense amplifier circuit.

6. The memory cell of claim 4, wherein the memory circuit and the read circuit are fabricated as an integrated circuit within a rectangular circuit area, said memory circuit occupying a first portion of the rectangular circuit area and the read circuit occupying a second portion of the rectangular circuit area, said first and second portions being adjacent to each other.

7. The memory cell of claim 1, wherein the first enable signal changes logic state simultaneously with the second enable signal changing logic state, said first enable signal controlling the at least one n-channel transistor to selectively clamp at least one of the true output or complement output to a reference supply voltage node, and said second enable signal controlling the at least one p-channel transistor to selectively enable a latching operation by the RS flip flop circuit.

8. A memory cell fabricated as an integrated circuit within a rectangular circuit area, comprising:
a memory circuit occupying a first portion of the rectangular circuit area; and
a read circuit occupying a second portion of the rectangular circuit area;
wherein said first and second portions are adjacent to each other;
said memory circuit comprising:
a floating gate transistor memory element;
a latch circuit having a first input coupled to data input line and a first output coupled to the floating gate transistor memory element; and
an output transistor coupled to a data output line and having a control terminal coupled to a second output of the latch circuit;
said read circuit comprising:
an input coupled to the output transistor; and
a latching sense amplifier circuit coupled to the input.

9. The memory cell of claim 8, wherein the latch circuit comprises: a reset/set (RS) flip flop circuit having a set input coupled to the coupled to data input line, a true output coupled to the output transistor and a complement output coupled to the floating gate transistor memory element.

10. The memory cell of claim 9, wherein the latch circuit further includes at least one n-channel transistor having a gate terminal driven by a first enable signal and at least one p-channel transistor having a gate terminal driven by a second enable signal, wherein during a read mode of operation for the memory cell said first and second enable signals are not simultaneously asserted.

11. The memory cell of claim 10, wherein the first enable signal changes logic state prior to the second enable signal changing logic state, said first enable signal controlling the at least one n-channel transistor to selectively clamp at least one of the true output or complement output to a reference supply voltage node, and said second enable signal controlling the at least one p-channel transistor to selectively enable a latching operation by the RS flip flop circuit.

12. The memory cell of claim 10, wherein during a write mode of operation for the memory cell said first and second enable signals are simultaneously asserted.

13. The memory cell of claim 12, wherein the first enable signal changes logic state simultaneously with the second enable signal changing logic state, said first enable signal controlling the at least one n-channel transistor to selectively clamp at least one of the true output or complement output to a reference supply voltage node, and said second enable signal controlling the at least one p-channel transistor to selectively enable a latching operation by the RS flip flop circuit.

14. The memory cell of claim 8, wherein the read circuit further includes an output inverter circuit having an input coupled to an output of the latching sense amplifier circuit.

15. A memory array, comprising a plurality of memory cells, wherein each memory cell is fabricated as an integrated circuit within a rectangular circuit area, the rectangular circuit areas of the memory cells arranged adjacent to each other in one of a column or row of the memory array, each memory cell comprising:
a memory circuit occupying a first portion of the rectangular circuit area; and
a read circuit occupying a second portion of the rectangular circuit area;
wherein said first and second portions are adjacent to each other;
said memory circuit comprising:
a floating gate transistor memory element;
a latch circuit having a first input coupled to data input line and a first output coupled to the floating gate transistor memory element; and
an output transistor coupled to a data output line and having a control terminal coupled to a second output of the latch circuit;
said read circuit comprising:
an input coupled to the output transistor; and
a latching sense amplifier circuit coupled to the input.

16. The memory array of claim 15, wherein the latch circuit comprises: a reset/set (RS) flip flop circuit having a set input coupled to the coupled to data input line, a true output coupled to the output transistor and a complement output coupled to the floating gate transistor memory element.

17. The memory array of claim 16, wherein the latch circuit further includes at least one n-channel transistor having a gate terminal driven by a first enable signal and at least one p-channel transistor having a gate terminal driven by a second enable signal, wherein during a read mode of operation for the memory cell said first and second enable signals are not simultaneously asserted.

18. The memory array of claim 17, wherein the first enable signal changes logic state prior to the second enable signal changing logic state, said first enable signal controlling the at least one n-channel transistor to selectively clamp at least one of the true output or complement output to a reference supply voltage node, and said second enable signal controlling the at least one p-channel transistor to selectively enable a latching operation by the RS flip flop circuit.

19. The memory array of claim 15, wherein the plurality of memory cells form a register.

20. A memory cell, comprising:
a memory circuit, comprising:
a first floating gate transistor coupled between a source line and a first latch node;
a second floating gate transistor coupled between the source line and a second latch node;
a first true data input line;
a second complementary data input line; and
a reset/set (RS) flip flop circuit having a set input coupled to the first true data input line, a reset input coupled to the second complementary data input line, a true output and a complement output, and further including:
a first n-channel transistor having a source-drain path coupled between the true output and a first supply voltage node and having a gate terminal driven by a first enable signal,
a second n-channel transistor having a source-drain path coupled between the true output and the first supply voltage node and having a gate terminal coupled to the reset input, and
a first p-channel transistor having a source-drain path coupled between the true output and a second supply voltage node and having a gate terminal driven by a second enable signal.

21. The memory cell of claim 20, wherein the first and second enable signals are not logical complements of each other.

22. The memory cell of claim 20, wherein during a read mode of operation for the memory cell said first and second enable signals are not simultaneously asserted.

23. The memory cell of claim 20, wherein during a write mode of operation for the memory cell said first and second enable signals are simultaneously asserted.

24. The memory cell of claim 20, wherein the reset/set (RS) flip flop circuit further includes:
   a third n-channel transistor having a source-drain path coupled between the complement output and the first supply voltage node and having a gate terminal driven by the first enable signal,
   a fourth n-channel transistor having a source-drain path coupled between the complement output and the first supply voltage node and having a gate terminal coupled to the set input, and
   a second p-channel transistor having a source-drain path coupled between the complement output and a second supply voltage node and having a gate terminal driven by the second enable signal.

\* \* \* \* \*